United States Patent [19]

Testa et al.

[11] Patent Number: 5,845,234
[45] Date of Patent: Dec. 1, 1998

[54] SYSTEM AND METHOD FOR EFFICIENTLY GENERATING TESTING PROGRAM CODE FOR USE IN AUTOMATIC TEST EQUIPMENT

[75] Inventors: Louis C. Testa, Beaverton; Eric C. Martinson, Tigard, both of Oreg.

[73] Assignee: Integrated Measurement Systems, Inc., Beaverton, Oreg.

[21] Appl. No.: 844,807

[22] Filed: Apr. 22, 1997

[51] Int. Cl.[6] ................................. G01R 31/28
[52] U.S. Cl. .................. 702/119; 364/578; 371/22.1; 371/48; 395/500; 395/183.01
[58] Field of Search .................. 364/580, 550, 364/551.01, 570, 578; 324/73.1; 371/22.1, 27.1, 21.1, 48; 395/500, 180, 183.01, 183.08, 183.13, 183.15, 185.01; 702/119

[56] References Cited

U.S. PATENT DOCUMENTS

| | | | |
|---|---|---|---|
| 4,868,785 | 9/1989 | Jordan et al. | 364/900 |
| 4,894,829 | 1/1990 | Monie et al. | 371/20.1 |
| 5,206,582 | 4/1993 | Ekstedt et al. | 324/73.1 |
| 5,371,851 | 12/1994 | Pieper et al. | 395/164 |
| 5,377,203 | 12/1994 | Khan | 371/27 |
| 5,434,805 | 7/1995 | Iwasaki | 364/580 |
| 5,446,742 | 8/1995 | Vahabi et al. | 371/27 |
| 5,541,862 | 7/1996 | Bright et al. | 364/580 |
| 5,615,219 | 3/1997 | Keating et al. | 371/27 |
| 5,668,745 | 9/1997 | Day | 364/580 |

OTHER PUBLICATIONS

IMS, "IMS Announces Significant Enhancements in Virtual Test Enviroment" Oct. 21, 1996.
Bradely et al., "Hewlett–Packard Report", Electronic News, Feb. 10, 1997.
Cadence Design Systems, "Tester Aim to Cut Costs", Electronic Engineering Times, Aug. 8, 1994.
Novellino, "Test Station delivers ATE–like Performance", Electronic Design, Oct. 10, 1991.

*Primary Examiner*—John E. Barlow, Jr.
*Assistant Examiner*—Patrick Assouad
*Attorney, Agent, or Firm*—Marger Johnson & McCollom, P.C.

[57] ABSTRACT

A system and method for generating testing program code for testing an electronic device on an automatic test equipment (ATE) platform are described. The ATE platform is interconnectable to a testing workstation comprising a processor, memory and input/output facilities. The electronic device under test is removably coupled to the ATE platform. The ATE platform further includes a tester for testing the electronic device responsive to the testing program code. The testing of the electronic device on the ATE platform is controlled by and results from the testing of the electronic device are displayed using the input/output facilities of the testing workstation. A library of ATE platform parameters associated with the testing workstation is maintained and the ATE platform parameters for a plurality of ATE platforms including the ATE platform interconnectable to the testing workstation are stored in the library. The testing program code specific to the ATE platform interconnectable to the testing workstation is generated using the ATE platform parameters in the library.

21 Claims, 9 Drawing Sheets

SYSTEM AND METHOD FOR EFFICIENTLY GENERATING TESTING PROGRAM CODE FOR USE IN AUTOMATIC TEST EQUIPMENT

BACKGROUND OF THE INVENTION

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

This invention relates generally to automatic test equipment and more particularly to a system and method for efficiently generating testing program code for use in automatic test equipment.

Both digital integrated circuits, such as microprocessors and application-specific integrated circuits and mixed signal devices, such as analog-to-digital converters, require substantial testing to ensure high quality and performance with low defect levels. During electronics design, the testing of these devices is generally performed by automatic test equipment (ATE) which performs the testing under the control of a program.

Conventional ATE testing program generators suffer from several drawbacks. First, these testing programs are generally based on waveform descriptions of the data to be translated on the ATE. However, existing waveform translation techniques result in custom-built testing programs tailored to each specific ATE. Consequently, the programs tend to be lengthy, complicated and time-consuming to write. Moreover, there are a substantial number of commercially available ATE platforms and the task of writing and supporting testing programs for each ATE platform is expensive and resource intensive.

Second, existing waveform translation solutions require monolithic code generation modules. However, employing code modules customized for each problem tends to be inefficient. Furthermore, the code modules must be customized for operation on each new ATE platform.

Third, some ATE testing programs match input waveform to waveforms contained in lengthy look-up tables. Each waveform table entry must be hand-coded to conform to the specific requirements for each ATE platform. Creating these tables is a huge, error prone task. These types of programs tend to be inflexible and difficult to extend and are time consuming to create.

Fourth, existing translation solutions typically generate ATE testing programs based on a fixed organization as defined by the person writing the waveform translator. Parts of the default template are assigned to be filled with data during the transform process. At runtime, the program can be customized by the user to allow activation or removal of selected sections, although the overall structure of the program remains fixed. A testing program generated using this approach can be rearranged by manual editing, but the reworking of the generated code can include the addition of signals, voltage settings, timesets, formats, pattern data and program setup information. Performing this type of rework is labor intensive and makes it difficult to integrate the translation process into part of a larger design flow.

Therefore, there is a need for a system and method for performing waveform translation in an ATE platform-independent manner and which requires a minimal amount of data for each different ATE platform type.

There is a further need for an approach targeted at a wide range of ATE platforms and providing a user with visibility and control of the translation process by permitting viewing and editing of an intermediate data representation.

There is still a further need for an approach which is easy to program for a new ATE platform. Preferably, such an approach would use a single solution for substantially all translation cases rather than rely on extensive customized code written for each specific ATE platform, thereby avoiding the need to write new routines for each new ATE platform.

SUMMARY OF THE INVENTION

The present invention provides a system and method for efficiently generating testing program code for use in automatic test equipment. According to the invention, this is accomplished by separating the translation process into two steps. The first step translates a waveform description into a unified ATE format which is broad enough to cover a plurality of ATE platforms. The second step is to take the unified ATE format and supply the data in a simple iterative fashion for completing templates of test program modules.

One aspect of the present invention is a system for generating testing program code for testing an electronic device on an automatic test equipment (ATE) platform. The ATE platform is interconnectable to a testing workstation comprising a processor, memory and input/output facilities. The electronic device under test is removably coupled to the ATE platform. The ATE platform further includes a tester for testing the electronic device responsive to the testing program code. The testing of the electronic device on the ATE platform is controlled by and results from the testing of the electronic device are displayed using the input/output facilities of the testing workstation. A library of ATE platform parameters associated with the testing workstation is maintained and the ATE platform parameters for a plurality of ATE platforms including the ATE platform interconnectable to the testing workstation are stored in the library. The testing program code specific to the ATE platform interconnectable to the testing workstation is generated using the ATE platform parameters in the library.

Another aspect of the present invention is a method for efficiently generating testing program code for use in automatic test equipment. The testing program code specifies testing for a device under test connected to the automatic test equipment. A unified data description is formed using a waveform analyzer module responsive to a waveform description which stores processed simulation results for the device under test. The unified data description is combined with a template using a template completion module to form the testing program code for use in the automatic test equipment.

The foregoing and other objects, features and advantages of the invention will become more readily apparent from the following detailed description of a preferred embodiment of the invention which proceeds with reference to the accompanying drawings.

DETAILED DESCRIPTION

Figure 1:
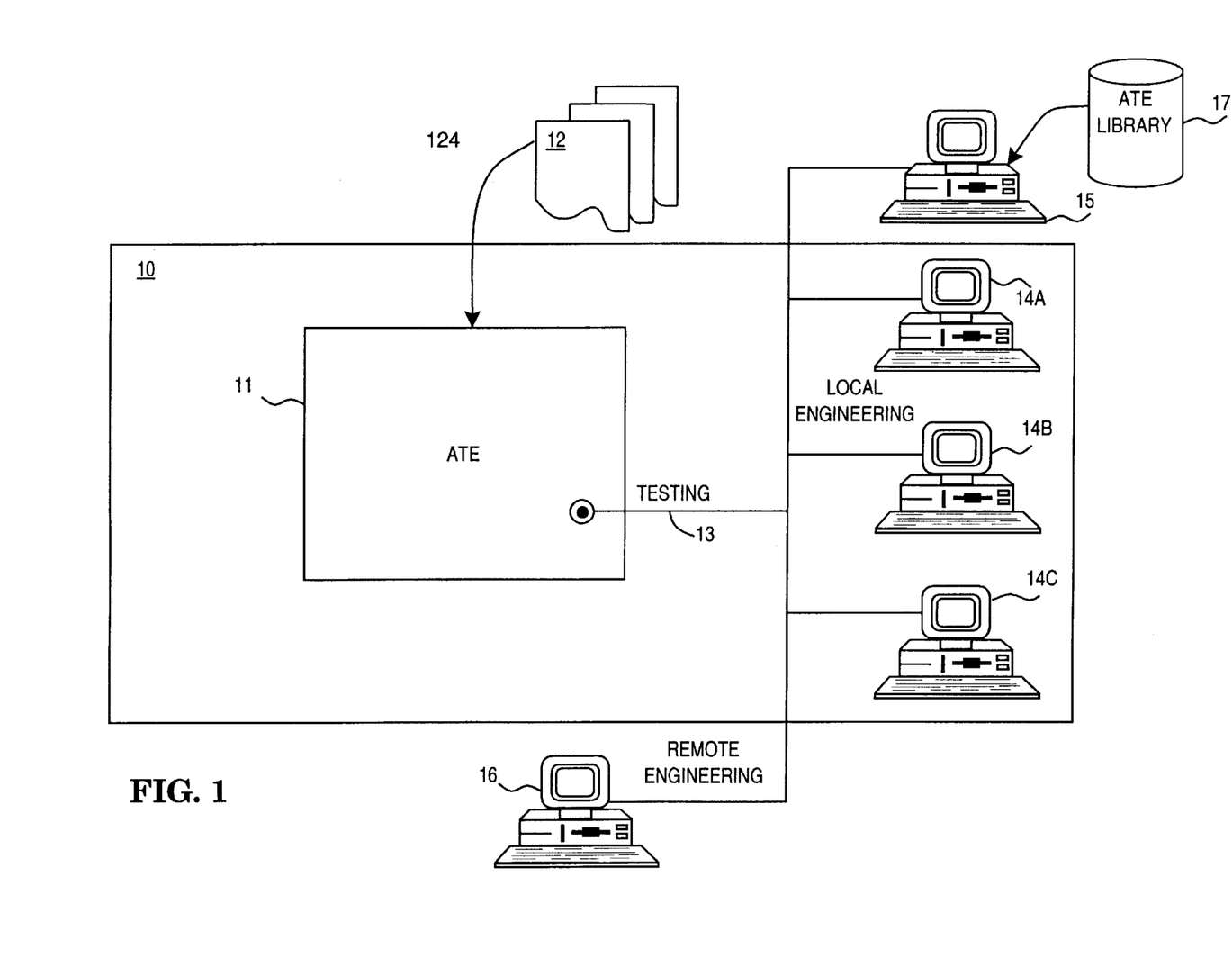
FIG. 1 is a block diagram of a system for efficiently generating testing program code for use in automatic test equipment according to the present invention.

I. Overview
II. Cyclized Waveform Description
  A. Cyclized Data
  B. Pattern Information
  C. ATE Channel and Device-Under-Test (DUT) Pin Information
III. ATE Characterization Tables
  A. Native Format
    1. Native Format Programming Tables
    2. Event Character Substitution Tables
    3. Timing Edge Mapping Controls Table
    4. Complex Shape Mapping Table
  B. Waveform Event-Based Format
    1. ATE Pin Information
    2. Pattern Information
    3. Waveform Information
IV. Waveform Transform Routine
  A. Pattern Data Transformation
  B. Timing and Format Information Transformation
V. Unified ATE Data Description
  A. Pin Tables
  B. Pattern Tables
  C. Format and Timing Tables
    1. Native Format
    2. Waveform Event-Based Format
VI. ATE Test Program Modules
VII. Template Completion Routine I. Overview FIG. 1 is a block diagram of a system 10 for efficiently generating testing program code for use in automatic test equipment (ATE) 11 according to the present invention. Conventional ATE 11, such as the MTS Advanced Test Station Series, manufactured and licensed by Integrated Measurement Systems (IMS), Beaverton, Oreg., test modern electronic devices under the control of testing programs 12, each testing program 12 comprising testing program code. The testing programs 12 are generated, as further described below with reference to FIG. 3 et seq., on an engineering workstation 15 physically interconnected with (or interconnectable to) the ATE 11 using data collected from a design-based simulation, although other data sources are feasible.

The testing workstation 15 can flexibly generate testing programs 12 for a plurality of ATE 11 platforms. The parameters specific to the various ATE platforms are stored in an ATE library 17 associated with the testing workstation 15. The ATE library 17 stores ATE characterization tables 31 and ATE templates 34, as further described below with reference to FIG. 3. Prior to testing, the user selects an ATE 11 platform and the testing workstation 15 generates the ATE-specific testing program 12 for the selected ATE platform. The testing program 12 is loaded into the ATE 11 which then tests the electronic device responsive to the testing program 12. The ATE 11 can be controlled by the testing workstation 15 which also displays the results of the testing. In the described embodiment, the testing can be performed enterprise-wide using a network 13, both locally at local testing workstations 14A–C and remotely at a remote testing workstation 16. Each of the testing workstations 14A–C, 15, 16 is a conventional computer, including a processor, memory and input/output facilities.

Figure 2:
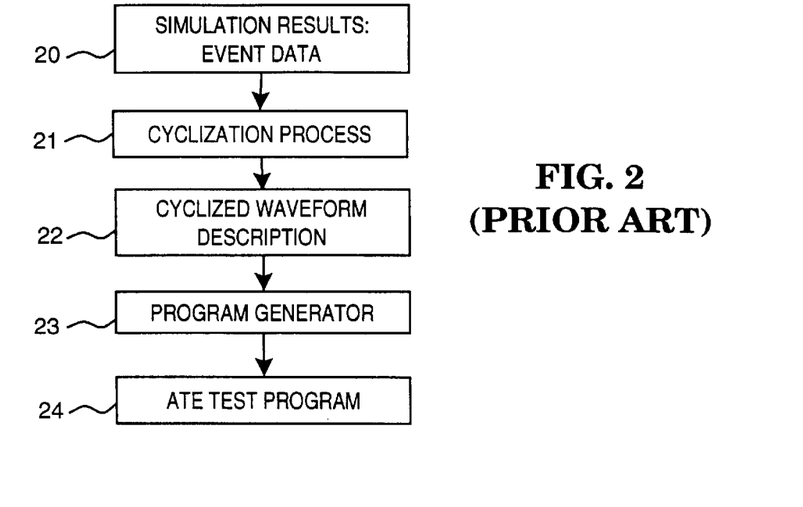
FIG. 2 is a block diagram of a prior art method for generating testing program code for use in automatic test equipment.

FIG. 2 is a block diagram of a prior art method for generating the testing program code 12 for use in the automatic test equipment 11. Cyclized waveform data 22 is provided as program inputs. Generally, the cyclized waveform data 22 consist of waveform-based pattern data associated with waveform templates. Each set of pattern data is defined for a number of events or signals. Each waveform template defines a reusable time slice which can be associated with multiple data pattern rows. Time slices are commonly referred to as "cycles." In essence, each waveform template describes what a set of electrical signals do at specific times relative to the start of a cycle. Specifications are designated for each waveform template and are usually defined for, but not limited to, a series of edge times associated with specific events. Examples of events include driving a specific logic level, turning off a driver, sampling data, driving a logic level specified by the pattern data associated with the cycle or other related functions.

The simulation results 20 are transformed into a cyclized waveform data 22 by a cyclization process 21. A number of approaches exist for cyclizing the simulation results 20, including the front end of TestDirect, a testing software program licensed by Integrated Measurement Systems, Beaverton, Oreg. The cyclized waveform data 22 is generated in a waveform description language for representing cyclized data as is known in the art.

After the simulation results 20 have been cyclized, the cyclized waveform data 22 is transformed into ATE-specific programs using a program generator 23. The cyclized waveform data 22 is converted into an ATE testing program code 24 containing format and timing information for use in a wide variety of ATE implementations. For the purposes of the present discussion, there are two types of formats for representing the ATE testing program codes 24: native and waveform event-based, as described further below in Section III. Briefly, the native format has a list of fixed formats describing multiple events and six timing edges per signal: two force, two compare and two direction. The waveform event-based format uses events and times.

The prior art method for generating testing program code 11 shown in FIG. 2 suffers from several drawbacks. First, the resultant ATE testing program code 24 is tailored to each specific ATE 11 and therefore expensive and resource intensive to support. Second, the method requires monolithic code generation modules that must be customized for operation on each new ATE 11. Third, the simulation results 20 must be matched to waveforms contained in lengthy look-up tables (not shown), resulting in an ATE testing program code 24 that is inflexible and difficult to extend. Fourth, the ATE testing program code 24 is based on a fixed template and reworking is labor intensive and difficult to integrate into part of a larger design flow.

Figure 3:
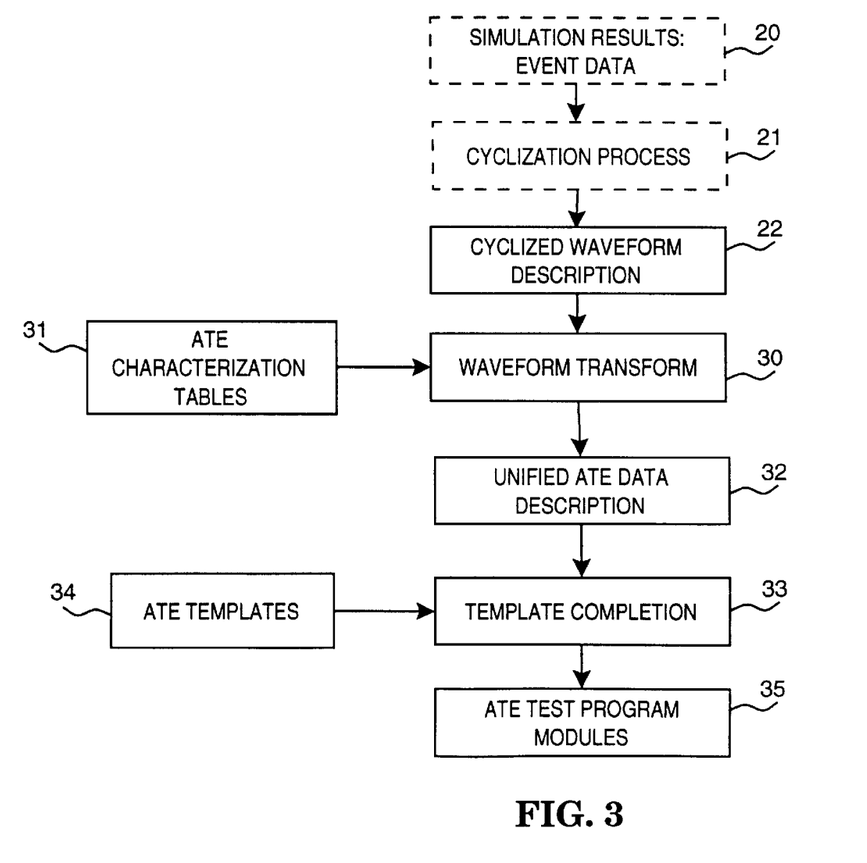
FIG. 3 is a block diagram of a method for generating testing program code for use in automatic test equipment according to the present invention.

FIG. 3 is a block diagram of a method for generating testing program code 12 for use in ATE 11 according to the present invention. The method is designed around forming an intermediate data set, called a unified ATE data description 32, which describes the direct characteristics of the ATE 11, rather than employing derived waveform information as used in the prior art. The method comprises two major steps: a waveform transform 30, which performs complex shape remapping and a template completion 33, which performs native shape format and timing look-up.

The simulation results 20, cyclization process and cyclized waveform data 22 are the same as used in the prior art method described with reference to FIG. 2. However, the prior art program generator 23 step is replaced two steps for performing a waveform transform 30 and template completion 33. The waveform transform 30 step references a set of ATE characterization tables 31 to form a unified ATE data description 32. In turn, the template completion 33 references a set of ATE templates 34 to generate ATE program modules 35 as program output. The cyclized waveform data 22, waveform transform 30 step, ATE characterization tables 31, unified ATE data description 32, template completion 33 step, ATE templates 34 and ATE testing program code modules 35 are respectively described below in Sections II–VIII.

II. Cyclized Waveform Description

Figure 4:
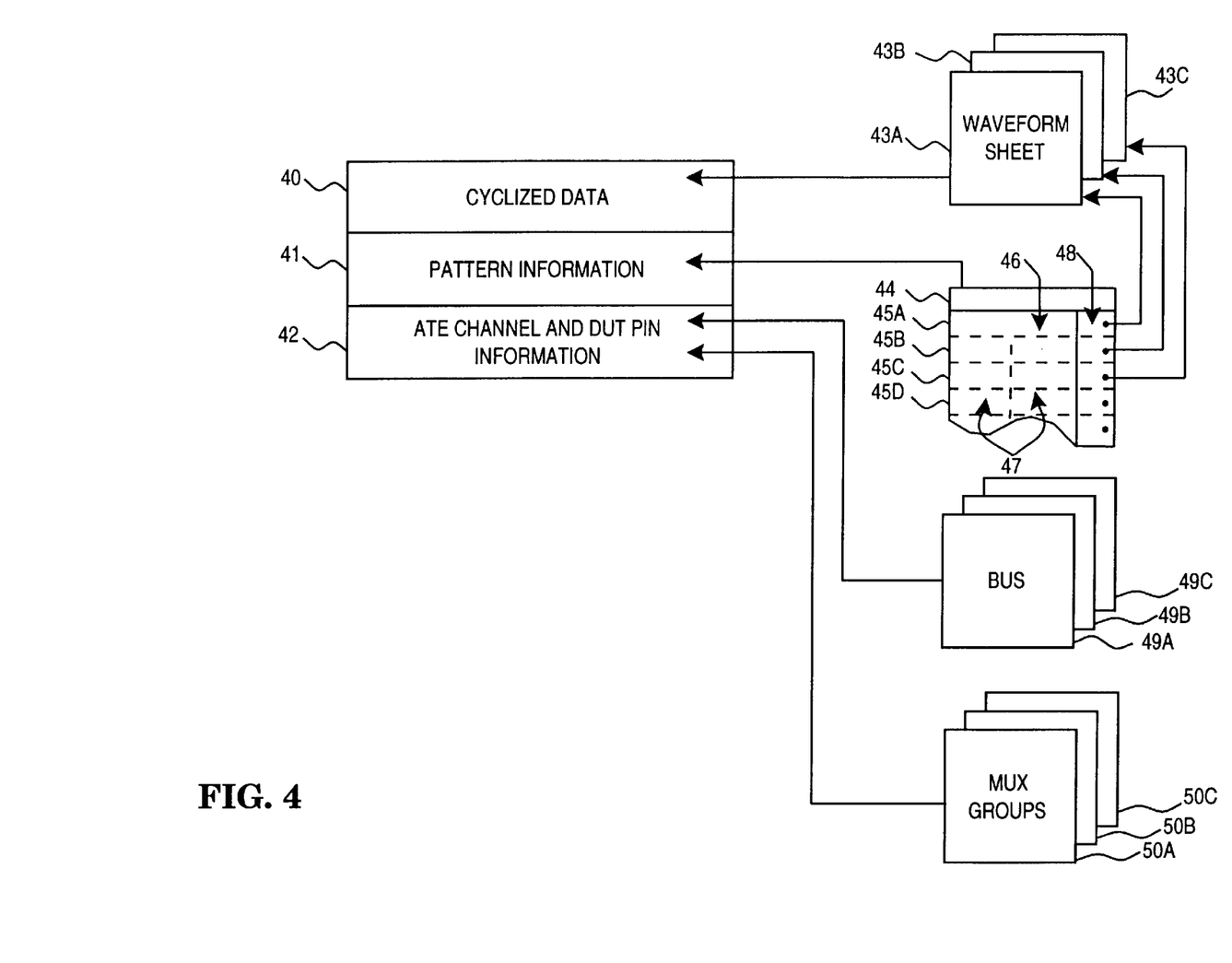
FIG. 4 shows a data structure for storing the cyclized waveform description used in the method of FIG. 3.

FIG. 4 shows a data structure for storing the cyclized waveform data 22 used in the method of FIG. 3. In the described embodiment, the cyclized waveform data 22 is expressed in a waveform description language as is known in the art. The cyclized waveform data 22 stores cyclized data 40, pattern information 41 and ATE channel and device-under-test (DUT) pin information 42 as described in the following sections.

A. Cyclized Data

The cyclized data 40 is stored according to a standard syntax for describing the waveform event data and pattern information. The standard syntax is based on a modified STIL character set as shown below in Table 1.

TABLE 1

| Character | Meaning |
| --- | --- |
| D | Force Low |
| U | Force High |
| S | Force to Pattern Value |
| C | Force to Inverse Pattern Value |
| Z | Force Tristate |
| P | No Event (placeholder - no edge) |
| X | Compare Don't Care |
| L | Compare Low |
| H | Compare High |
| Q | Compare Strobe (edge or window) to Pattern Value |
| E | Compare Edge Strobe to Pattern Value |
| W | Compare Window Strobe to Pattern Value |
| R | Compare Strobe to Inverse Pattern Value |
| T | Compare Tristate |

In the prior art, ATE formats are generally ambiguous. For example, the ATE format for specifying a return to zero (RZ) condition has two common usages on different ATE platforms: PSD and DSD. In the described embodiment, the ambiguous ATE formats are replaced by "shapes." Each shape specifies a definitive description of event sequences created by combining the letters shown in Table 1. Time values are associated with each of these letters to fully describe an event sequence. For a signal, the event sequence can be represented by a comma separated list. For example, the event sequence "P/0 ns, S/10 ns, D/20 ns" specifies a return to zero condition with event times at 10 ns going to state value and 20 ns going back to force low.

Waveforms events per signal are grouped by waveform sheets 43A–C 43A–C with each waveform sheet 43A containing all signals with their associated event sequence. Each waveform sheet 43A is assigned a reference name and period time as shown below in Table 2.

TABLE 2

| Name | Type | Description |
| --- | --- | --- |
| sheetName | string | Unique waveform sheet 43A identifier |
| sheetPeriod | time | Cycle length for the waveform sheet |
| eventSequence | string | List of characters and times events |
| shape | string | Just the event characters, no times |

An example of cyclized data 40 according to the data structure of FIG. 4 is shown below in Example 1. In the example, the enable signal has no event at the beginning of the cycle which is equivalent to adding a P/0 ns event at the beginning instead.

EXAMPLE 1

```
waveform(wf1, 50s)  {
        enable = S/10ns, D/20ns;
        data = X/0ns, E/20ns, X/30ns;
}
```

B. Pattern Information

The pattern information 41 refers to the events in the corresponding cycle by signal name. Each set of pattern information 41 consists of a header line 44 and rows of the pattern data 45A–D. The header line 44 describes the order of signal names in the pattern data rows 45A–D. Each signal can have one column 46 or two columns 47 of associated pattern data depending upon whether the signal is for a bi-directional pin. Each pattern data row 45A contains a reference 48 to the name of an associated waveform sheet 43A which describes the events that occur in the cycle. In addition, one of the pattern data rows 45A–D contains an order list for the pattern data and appears in the same order as the header line 44. Each set of actual pattern data has associated values for representing data high, data low, data don't care and data tristate conditions. In the described embodiment, the pattern data for these associated values are respectively represented as 1, 0, x and z.

An example of a pattern information 41 according to the data structure of FIG. 4 is shown below in Example 2.

EXAMPLE 2

```
pattern(signal1, signal2, signal3) {
        ws1 {101};
        ws2 {01x};
}
```

C. ATE Channel and DUT Pin Information

The ATE channel and DUT pin information 42 associates signal information with ATE channel and DUT pin information. Waveform events are associated with signals. However, the signals have no substantive meaning to an ATE 11 but can be used as placeholders for allowing association of waveforms with data patterns. In addition, each signal can be associated with ATE pin and DUT pin information which can include: (1) ATE channel name; (2) ATE channel number; (3) DUT name; and (4) DUT number.

In addition to providing signal-specific information, the signals can be grouped into higher level constructs which include: (1) buses 49A–C; and (2) multiplexed groups 50A–C. Each bus 49A is an indexed list of signals all associated with one name. Each multiplexed group 50A is a grouping of two or more signals which are grouped together to show combined signal information.

ATE channel and DUT pin information is assigned a reference name and type as shown below in Table 3.

TABLE 3

| Name | Type | Description |
|---|---|---|
| signalName | string | Signal name associated with events and pattern data |
| signalDir | enum | Direction ("in," "out" or "inout") |
| chanName | string | ATE channel name |
| chanN | int | ATE channel number |
| dutName | string | DUT name |
| dutN | int | DUT number |

III. ATE Characterization Tables

In the described embodiment, the ATE characterization tables 31 are used for specifying a minimum set of information relevant to each target ATE 11. At the top level, a simple table of questions describing the overall characteristics is required. At a lower level, descriptions of the generic format timing mapping and module templates which show the layout of the output language are required.

The most fundamental differences between the various ATE platforms appear in their respective format and timing sections. Pin assignments, voltage levels and pattern sections tend to be similar. The two formats for representing the ATE test programs 24: native and waveform event-based. ATE 11 employing native format test programs 24 use a series of fixed formats for describing one or more edge events with some ability to set the timing of these events. These ATE 1 1 platforms typically allow one to three events per native format and many have the ability to extend the number of events through a variety of schemes, including multiplexing. ATE 11 employing waveform event-based format test programs 24 are programmed by events and times.

A. Native Format

Figure 5:
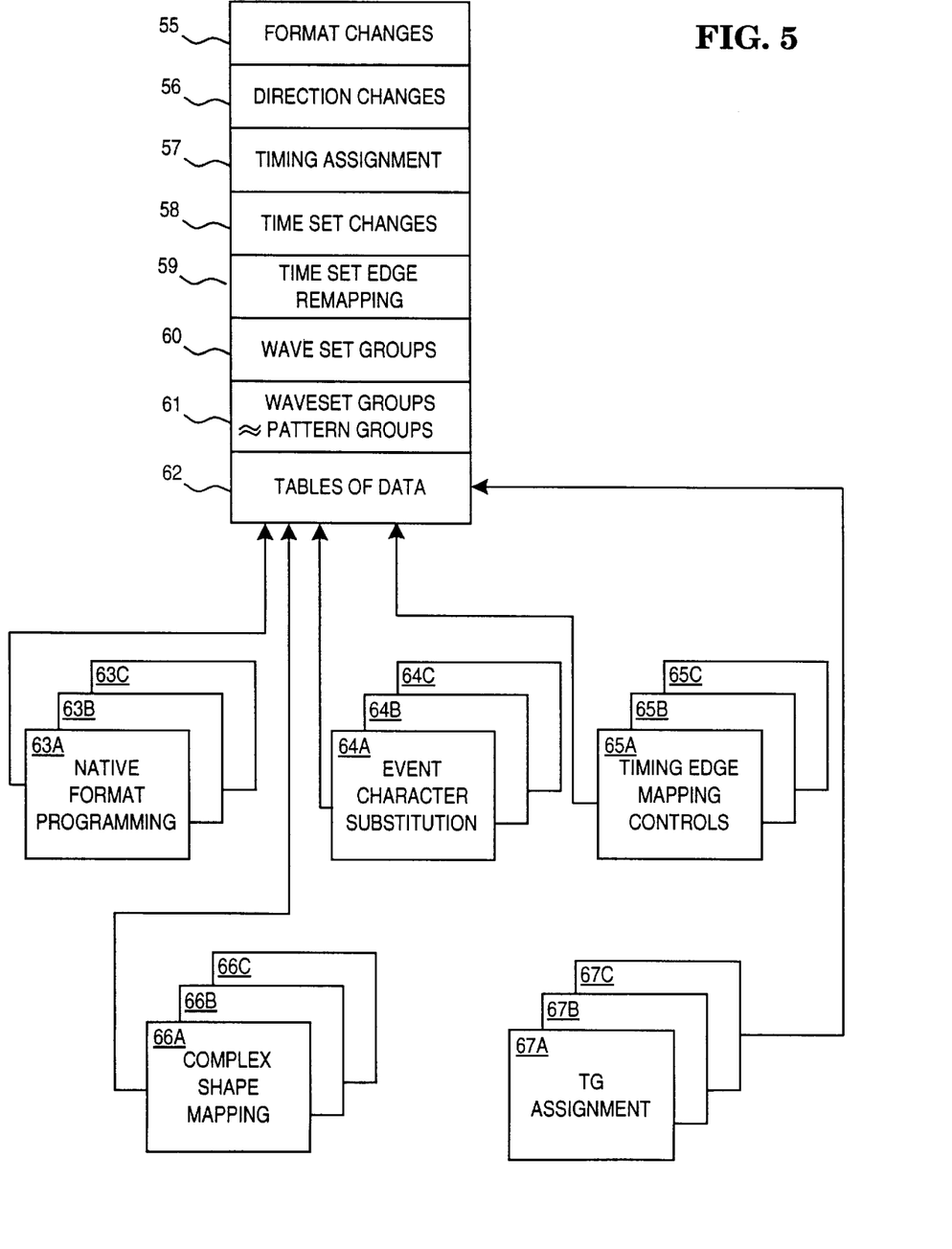
FIG. 5 shows a data structure for storing the ATE characterization table used in the method of FIG. 3.

FIG. 5 shows a data structure for storing the ATE characterization table 31 used in the method of FIG. 3. In the described embodiment, the format and timing information stored in each of the ATE characterization tables 31 for the native format characterizations tables includes:

(1) Format Changes (55): Format-Per-Pin versus Format-on-the-Fly. The Format-Per-Pin characteristic indicates the ATE 11 does not allow the native format to change on a pin between tester cycles, while the Format-on-the-Fly indicates the ATE 11 allows format changes between cycles.

(2) Direction Changes (56): Direction-Per-Pin versus Direction-on-the-Fly. The Direction-Per-Pin characteristic indicates the input/output direction switching format is fixed throughout the test, while the Direction-on-the-Fly characteristic indicates the direction format can be changed during the test.

(3) Timing Assignment (57): Timing-Per-Pin versus Timing Generator Assignments. The Timing-Per-Pin characteristic indicates the ATE 11 employs timing edge placement which is independently assigned on a per pin basis, while the Timing Generator Assignment characteristic indicates the ATE 11 requires that timing generators be programmed and assigned to groups of machines.

(4) TimeSet Changes (58): TimeSet-Per-Pin versus TimeSet-on-the-Fly. The TimeSet-Per- Pin characteristic indicates the ATE 11 does not allow timeset changes between cycles, while the TimeSet-on-the-Fly characteristic indicates the ATE 11 does allow timeset changes.

(5) WaveSet Groups (60), arranged by:
   (a) Timing/Format: WaveSet groups arranged by timing, format and data pattern control.
   (b) Input/Output (I/O): WaveSet groups arranged into input and output groups. Bidirectional signals are placed in both groups.

(6) WaveSet Groups equivalenced to PatternGroups (61): Some types of ATE 11, such as the IMS FT, allow the pattern channel order to be determined by the ordering of the waveset groups. For these platforms, the waveset groupings are the same as the pattern groupings.

(7) Tables of Data (62) (further described below).
   (a) Native Format Programming Tables (63A–C) (required in preferred embodiment).
   (b) Event Character Substitution Tables (64A–C) (optional).
   (c) Timing Edge Mapping Controls Table (65A–C) (optional).
   (d) Complex Shape Mapping Table (66A–C) (optional).
   (e) Timing Generator (TG) Assignment Table (67A–C) (optional).

I. Native Format Programming Tables

In the described embodiment, a standard model of the native formats for each ATE 11 is employed. There can be multiple native format programming tables 63A–C with the first table 63A acting as the primary set of formats to be used. Other tables 63b–c can be invoked for more complex ATE features.

Each native format programming table 63A consists of:
(1) Format Name (string).
(2) Edge event sequence (shape) which uniformly describes the format.
(3) Format Direction: force (input), compare (output) or bidirection (both input and output).
(4) Flag indicating if the first force edge or compare edge can be shifted over so it falls on the beginning of the cycle.
(5) "xF" flag that is set to a D1 or D2 value if HiZ can be inserted in front. of the format being evaluated. The D1 and D2 values indicate the edge to be programmed with the HiZ to Force transition.
(6) "Fx" flag that is set to a D2 or D1 value if Hiz mode can be switched to after force. The edge indicates the programming of the D1 and D2 values at the force to HiZ transition.
(7) Edge timing assignment consisting of two force, two compare and two direction edges. A corresponding integer event number in the cycle is assigned for each edge. The D1 and D2 direction edge assignments vary per ATE 11, but generally the D1 value is set to enable forcing and the D2 value is set to enable compare.
(8) Pattern mapping characters for force and compare. These characters look like the shape characters and describe how the pattern characters are to be handled on cycles using this format. S, Q, E or W values indicate the value should be used directly. C (force) or R (compare) values indicate the value should be inverted. D, U, Z, T, L or H values indicate the pattern value should be ignored and this character value substituted in its place.

(9) TG Category. On TG resource group ATE 11 platforms, each format has different TG requirements. These requirements are denoted simply by letters, starting with the letter "A." Any format that has the same letter requires the same type of TG category for programming. A separate TG table describes the ATE-specific text to associate with each class of TG category. A numeral appearing in front of the letter indicates the number of TGs consumed by this format. No numeral indicates one TG is used.

2. Event Character Substitution Tables

During the waveform transform 30 step, a native format programming table 63A is optionally referenced to determine the possible shapes and to program edges. In addition, pattern characters, such as described above in Table 1, can be set to fixed values for describing a non-native waveform format. For example, an "SBC" format with "CSC" shape can have its "S" character forced high ("U") to make it look like a "DUD" shape. In the described embodiment, the event character substitution tables 64A–C are provided to describe native format characters used to emulate non-native characters.

3. Timing Edge Mapping Controls Table

Optionally, additional edge assignment information might be needed to ensure proper programming which are stored in the timing edge mapping controls tables 65A–C. The list of items includes:

(1) Edge Masking: For indicating that one of F1, F2, C1, C2, D1 and D2 can have a masked value regardless of format.

(2) Edge Name Mapping: For defining a different set of strings for the standard F1, F2, C1, C2, D1 and D2 edges.

4. Complex Shape Mapping Table

Optionally, many ATE 11 platforms provide more complex methods of generating edge events than the native formats. These methods involve either multiplexing two or more pins together or using the six edges in a non-standard configuration to process more events per cycle. In the described embodiment, these two variations are handled through complex shape remapping tables 66A–C which each take one or two input signals and describes how their edges are reorganized when mapped to ATE channels.

Each complex shape mapping table 66A describes how format, timing and pattern control information get mapped to the one or two pins based on the following input data:

(1) Number of signals.

(2) If the two signals represent the special case of I/O on cycle boundaries, an indicator representing the two signals attached to a parent signal.

(3) The direction of the input signals (force or compare).

(4) Number of ATE pins to map (typically one or two).

From this input data, a mapping is defined which includes:

(1) A format list to select (0—no list as feature is not available, 1—standard native formats, 2 . . . N—alternate format lists).

(2) Pin information for one or more pins, each list containing:

(a) F1, F2 source signal & edges, (b) C1, C2 source signal & edges, (c) D1, D2 source signal & edges, and (d) Fpat, Cpat source signals.

(3) Output direction format.

(4) ATE Multiplex status (number of multiplexer pins).

B. Waveform Event-Based

In the described embodiment, the format and timing information stored in the ATE characterization tables 31 for the waveform-based characterizations tables maps the standard characters to a revised character set. Each table includes ATE pin information, pattern information and waveform information.

1. ATE Pin Information

No transform information is required for dealing with the ATE pins.

2. Pattern Information

Pattern information relevant to the transform includes:

(1) List of allowed radices, (2) For each allowed radix, the maximum group size, (3) For standard characters, the characters to map to on the target ATE 11, and (4) Whether spaces are required between signals and groups.

3. Waveform Information

The waveform information maps the generic event characters to the tester-specific strings required by the target ATE 11.

IV. Waveform Transform Routine

Figure 6:
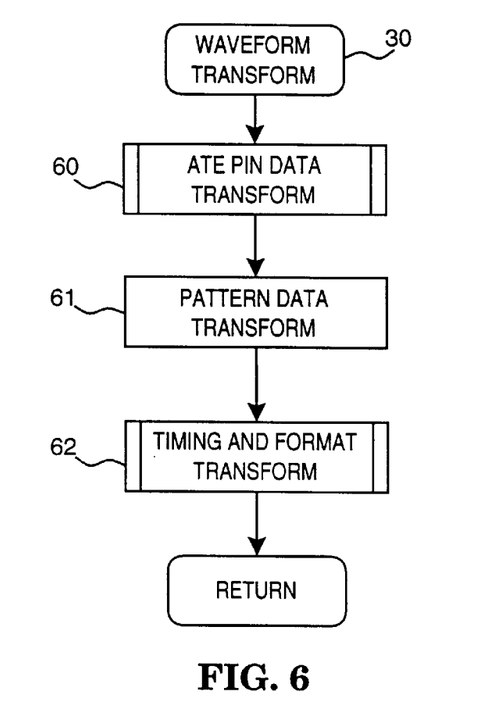
FIG. 6 is a flow diagram of the waveform transform routine used in the method of FIG. 3.

FIG. 6 is a flow diagram of a waveform transform routine 30 used in the method of FIG. 3. Its purpose is to transform the cyclized waveform data 22 into the unified ATE data description 32 by referencing the ATE characterization tables 31. The cyclized waveform data 22 can be in either native or waveform event-based formats, as described above in Section III. The overall waveform transform routine operates in three steps. First, ATE pin data is transformed (block 60). Next, pattern data is transformed (block 61). Finally, timing and format information is transformed (block 62).

A. Pattern Data Transformation

The pattern header and data must be modified to fit the constraints of each particular ATE 11 platform. These modifications consist of the following:

(1) Group patterns as instructed by the user.

(2) Output groups and busses in user-defined radices.

(3) Change column order to reflect user preferences.

(4) Change character set to reflect ATE requirements.

(5) Repeat row definitions.

B. Timing and Format Information Transformation

Figure 7A:
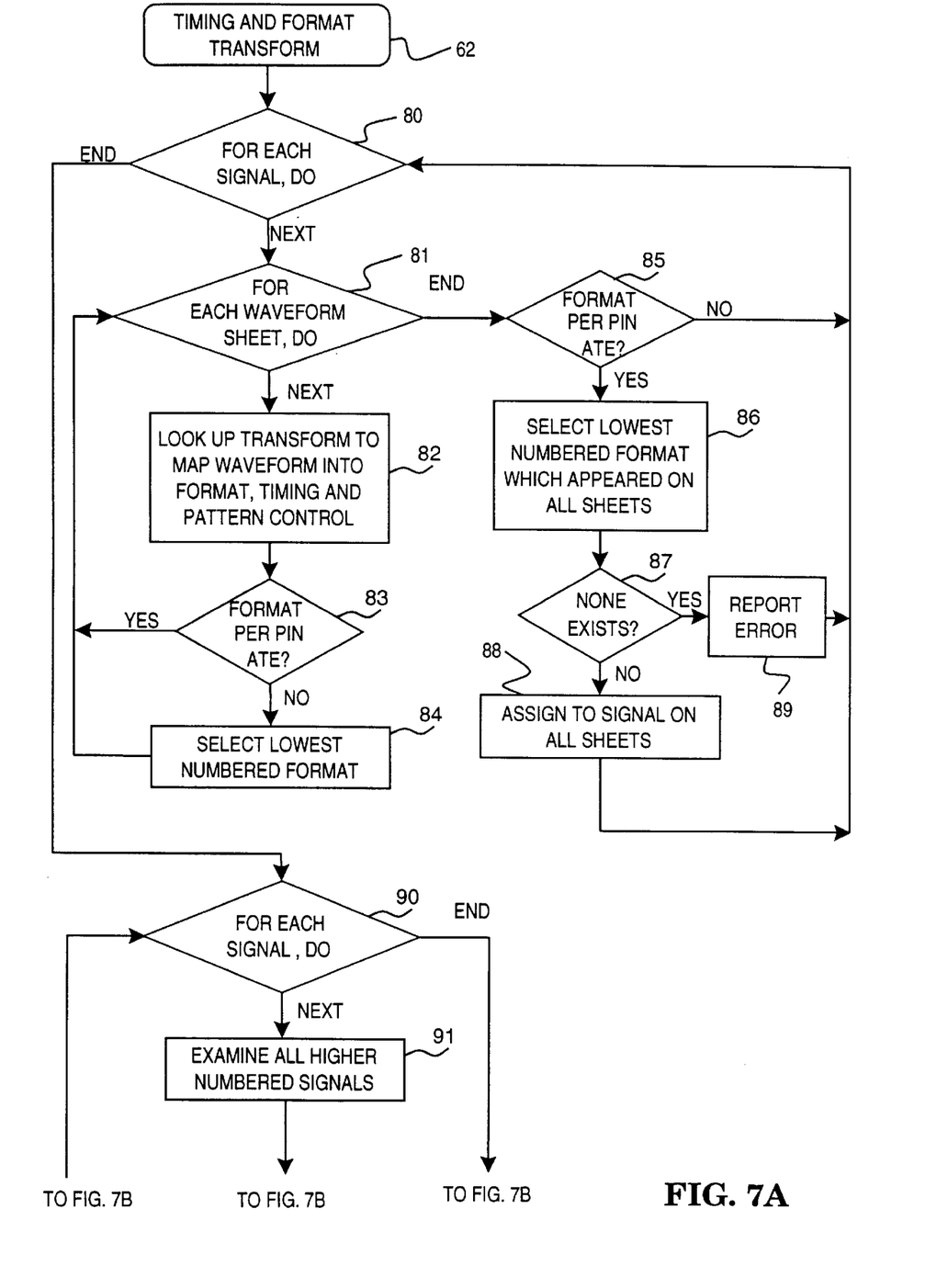
FIGS. 7A and 7B are flow diagrams of the timing and format transform routine used in the waveform transform routine of FIG. 6.
Figure 7B:
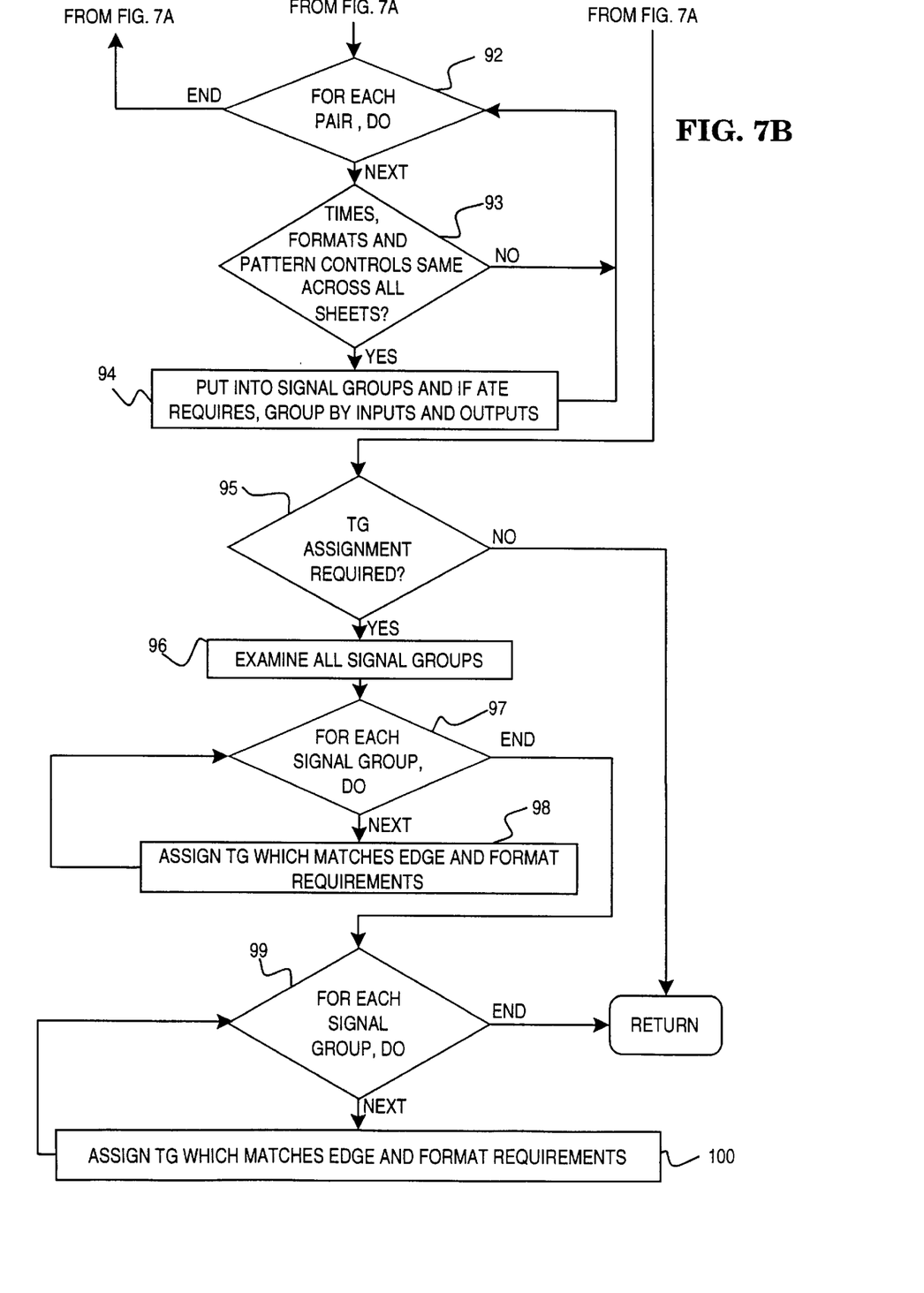

FIGS. 7A and 7B are flow diagrams of the timing and format transform routine 62 used in the waveform transform routine 30 of FIG. 6. Its purpose is to examine each signal across all of its waveform sheet 43A placements to generate the format and timing information required on the target ATE 11. Briefly, the routine operates in three main steps. A lower level transform is used to select formats, timing and pattern controls for each signal and waveform sheet 43A pairing (blocks 80–89). From these settings, the signals are built into groups of signals with common formats, timing and pattern controls (blocks 90–94). If the target ATE 11 does not assign a timing generator (TG) per pin, the TGs are assigned to the signal groups (blocks 95–100).

First, the lower level transform is performed in a pair of nested iterative loops (blocks 80–89) as follows. For each signal (block 80), the following steps are performed. For each waveform sheet 43A (block 81), the transform is looked up to map the waveform into format, timing and pattern controls (block 82). If the waveform sheet 43A is not for a format per pin ATE 11 (block 83), the lowest numbered format is selected (block 84) and processing continues with the next waveform sheet 43B (block 81). Otherwise, if the sheet is for a format per pin ATE 11 (block 83), no further steps are required and processing continues with the next waveform sheet 43B (block 81). Once all waveform sheets 43A–C have been processed (block 81), if the target ATE does not use format per pin (block 85), processing continues with the next signal (block 80). If the target ATE 11 uses format per pin (block 85), the lowest numbered format which appears all waveform sheets 43A–C is selected (block 86). If none exists (block 87), an error condition is reported (block 89) and processing continues with the next signal (block 80). Otherwise, a signal is assigned on all sheets (block 88) and processing continues with the next signal (block 80).

Once all signals have been processed (block 80), the signal groups are formed (blocks 90–94) as follows. For each signal (block 90), all higher numbered signals are examined (block 91). For each pair of signals (block 92), the following steps are performed. If the times, formats and pattern controls are not the same across all waveform sheets 43A–C (block 93), processing continues with the next pair (block 92). Otherwise, if the times, formats and pattern controls are the same across all waveform sheets 43A–C (block 93), the times, formats and pattern controls are put into signal groups and, if the ATE 11 requires, grouped by inputs and outputs (block 94) and processing continues with the next pair (block 92). Once all pairs have been processed (block 92), processing continues with the next signal (block 90).

Once all signals have been processed (block 90), any required TG assignments are performed (blocks 95–100) as follows. If a TG assignment is not required (block 95), the routine returns. Otherwise, if a TG assignment is required (block 95), all signal groups are examined (block 96). For each signal group (block 97), a TG is assigned which matches the edge and format requirements of the ATE 11 (block 98). Once all signal groups have been processed (block 97), again for each signal group (block 99), a TG is assigned based on a letter category using the same TG for signal groups having the same timing (block 100). A second pass over the grouped TG letter categories allows assignment of ATE specific TG names and numbers. Once all signal groups have been processed (block 99), the routine returns.

V. Unified ATE Data Description

Figure 8:
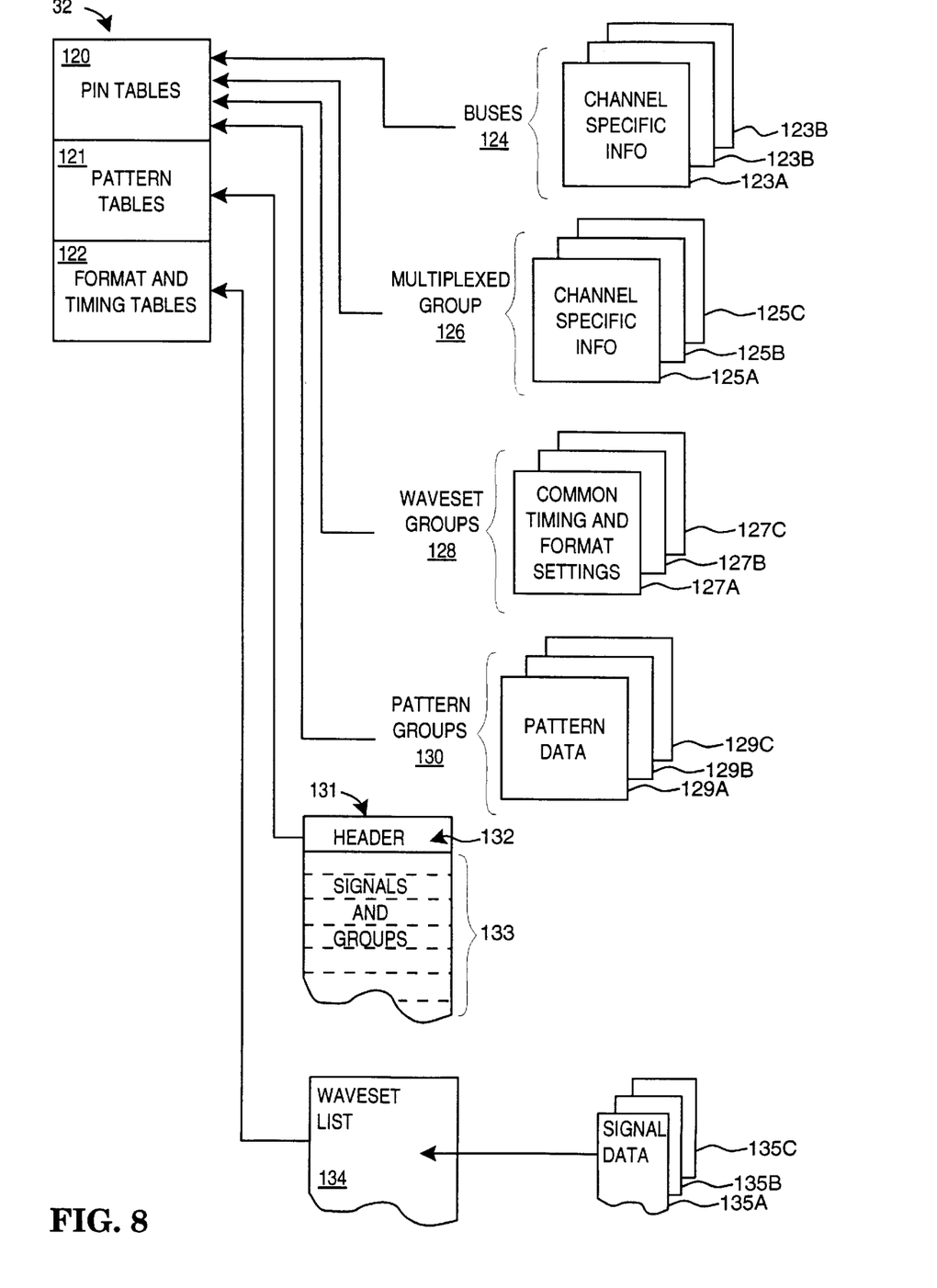
FIG. 8 shows a data structure for storing the unified ATE data description used in the method of FIG. 3.

FIG. 8 shows a data structure for storing the unified ATE data description 32 used in the method of FIG. 3. The unified ATE data description 32 is the result of the waveform transform 30 step. This data is in a form that allows simple mapping of the information into list driven templates for generating the output ATE test program modules 35. The unified ATE data description 32 contains tables for storing pin information 120, pattern information 121 and format and timing information 122.

A. Pin Tables

The pin tables 120 store essentially the same information as the ATE channel and DUT pin information 42 (shown in FIG. 4) with modified channel names additions as follows.

All shape patterns are attached to a channel for storing channel specific information which includes:

(1) ATE Channel Name;
(2) ATE Channel Number;
(3) DUT Name;
(4) DUT Number; and
(5) Whether the channel contains force, compare or bidirectional data.

In addition to the channel specific information, each channel can be grouped into higher level constructs which include:

(1) Buses (124): stores an indexed list of channels using the same name.
(2) Multiplexed group (126): stores a grouping of two or more channels to show combined information.

In addition to these two groups, two additional generated groupings are provided which include:

(1) WaveSet Groups (128): stores groups of channels 127A–C with common timing and format settings.
(2) Pattern Groups (130): stores groups of channels 129A–C into which pattern data is assigned as a group.

B. Pattern Tables

The pattern tables 121 are represented pictorially as a contiguous pattern block 131. However, the stored pattern information could also be optionally translated and inserted into the ATE test program modules 35 on a row-by-row basis.

Each pattern block 131 has a header statement 132 which defines the sequence of signals and groups that each of the rows 133 in the pattern block 131 will contain. In turn, each pattern row 133 consists of a waveset name followed by the pattern data and optionally microcode statements. In the described embodiment, two microcode instructions are supported: (1) repeat which is followed by a number of times the associated row 133 is repeated; and (2) subr which is followed by a subroutine call with optional arguments.

C. Format and Timing Tables

The format and timing tables 122 consists of two nested lists. The outer list 134 is a list of all wavesets. Each waveset list 134 corresponds to one of the waveform sheets 43A–C in the untranslated waveform language. Each inner list 135A–C is a list of all signals associated with data required to program the target ATE 11. This data can be represented in two different formats: native or waveform event-based.

1. Native Format

The inner lists 135A–C for the native format uses a standard set of data associated with each ATE channel which includes:

(1) Force Format (character string used on the target ATE 11);
(2) Compare Format (character string used on the target ATE 11);
(3) Optional Source Shape (waveform character string - comment);
(4) F1, F2: Force edges 1 and 2 (times);
(5) C1, C2: Compare edges 1 and 2 (times);
(6) D1, D2 : Direction edges 1 and 2 (times);
(7) Fpat: Force Pattern mapping (shape character); and
(8) Cpat: Compare pattern mapping (shape character).

2. Waveform Event-Based Format

In the described embodiment, the waveform event-based format is used with ATE 11 platforms lacking a native pre-programmed format. Generally, these ATE 11 platforms allow the user to program events at various times. The data associated with each signal is a series of pairs of event types and associated times. This representation is virtually identical in syntax to the generic waveform description. Each table of signal data 135A consists of a channel name, a target shape and a list of events with a character and time.

Examples of information stored in one of the format and timing tables 122 for waveform event-based format are shown below in Examples 3 and 4. Example 4 shows the format used by an ATE 11 platform that requires the "P" character on multiple events to represent the same data as the timing edges.

EXAMPLE 3

```
waveset (ws1, 100ns) {
    ch1 = P/0ns, S/20ns, D/40ns;
    ch2 = X/0ns, W/20ns, X/50ns;
}
```

EXAMPLE 4

```
waveset (ws1, 100ns) {
    ch1 = P/0ns, P/10ns, S/20ns, P/30ns, D/40ns;
    ch2 = X/0ns, P/10ns, W/20ns, P/30ns, P/40ns, X/50ns;
}
```

VI. ATE Test Program Modules

Figure 9:
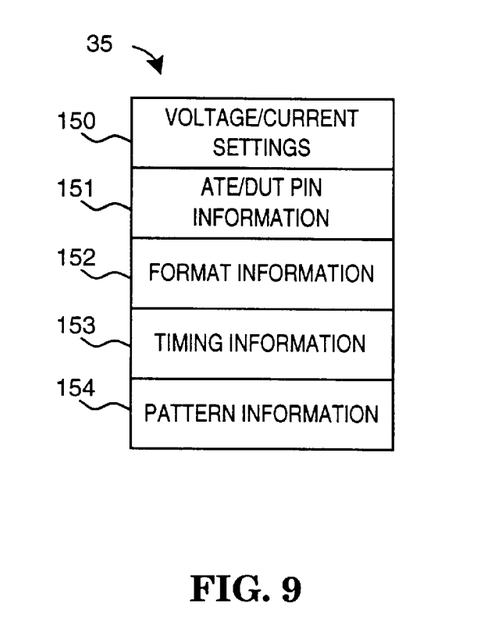
FIG. 9 shows a data structure for storing the ATE test program modules used in the method of FIG. 3.

FIG. 9 shows a data structure for storing the ATE test program modules 35 used in the method of FIG. 3. Each ATE test program consists of a standard set of modules 35 that can be generated from a waveform description language based on one of the ATE-specific templates 34. Each template 34 consists of empty program modules for specifying the layout of the resultant testing program 12 in an electronic device-independent manner. Each standard set contains the same information, but the organization varies between individual ATE 11 platforms. In particular, certain items are often grouped together. The base set includes:

(1) Voltage/Current Settings 150;
(2) ATE/DUT Pin Information 151;
(3) Format Information 152;
(4) Timing Information 153; and
(5) Pattern Information 154.

In the described embodiment, the translated ATE data is organized to facilitate output in a convenient manner. A set of structures each corresponding to a subcomponent in the DUT is used which includes structures for storing:

(1) Pattern;
(2) Channel;
(3) Waveset;
(4) Waveset/Channel;
(5) Groups of Channels for Pattern Output;
(6) Groups of Channels for WaveSet Output; and
(7) Timing Generator.

VII. Template Completion Routine

Figure 10:
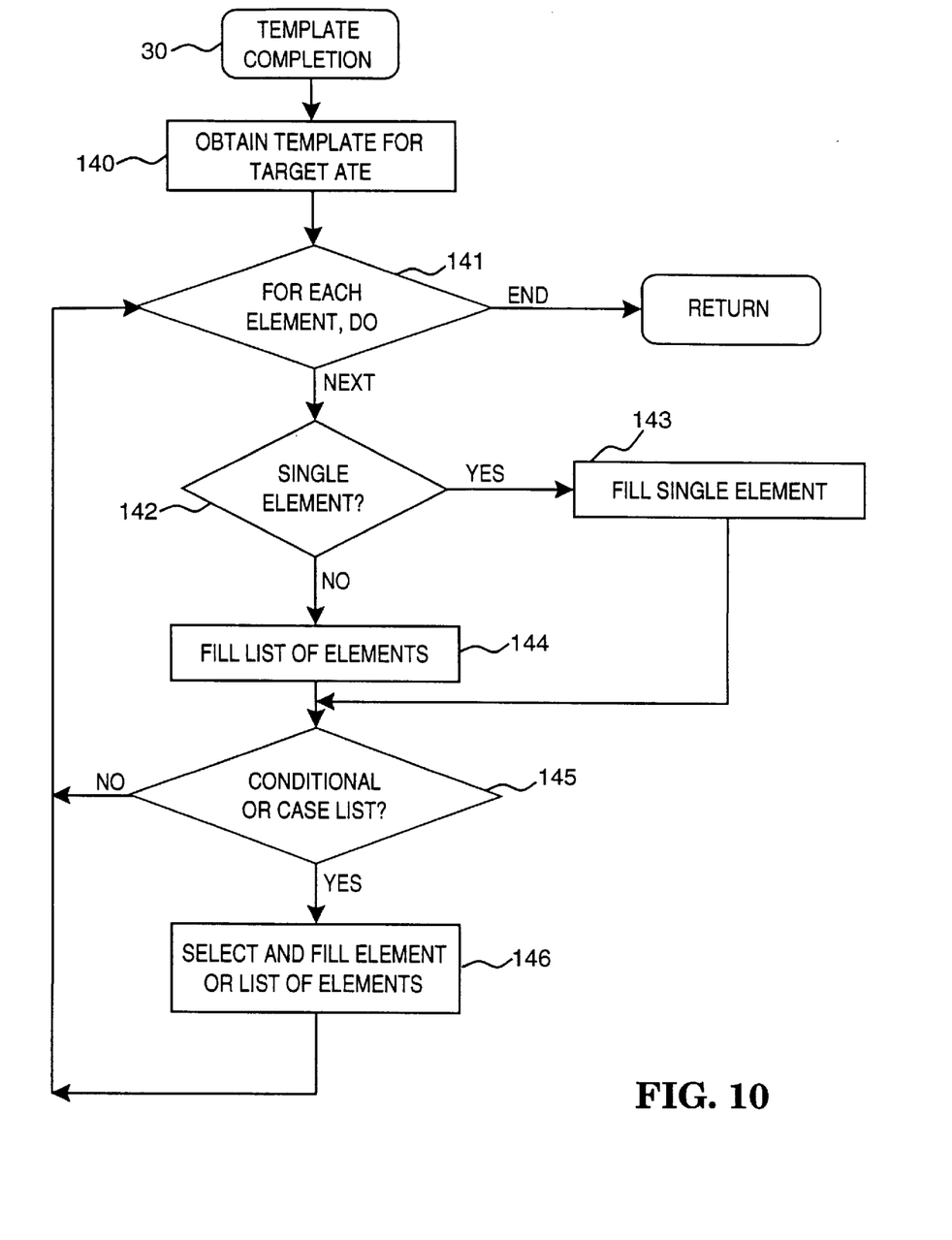
FIG. 10 is a flow diagram of the template completion routine used in the method of FIG. 3.

FIG. 10 is a flow diagram of the template completion routine 33 used in the method of FIG. 3. Its purpose is to traverse templates from start to finish for forming the ATE test program modules 35. During the template completion routine 33, a template 34 is first obtained for the target ATE 11 (block 140). Each element in the template is processed in an iterative loop (blocks 141–146) as follows. If the element is a single element (block 142), it is filled singly. Otherwise, if the element is not a single element, that is, a list of elements (block 142), the list of elements if filled (block 144). If the element does not contain a conditional statement or case list (block 145), processing continues with the next element (block 141). Otherwise, if the element contains a conditional statement or case list (block 145), the appropriate condition is selected and the element or list of elements are filled (block 146). Processing then continues with the next element (block 141). Once all elements have been processed (block 141), the routine returns.

Having described and illustrated the principles of the invention in a preferred embodiment thereof, it should be apparent that the invention can be modified in arrangement and detail without departing from such principles. We claim all modifications and variations coming within the spirit and scope of the following claims.

We claim:

1. A system for generating testing program code for testing an electronic device on an automatic test equipment (ATE) platform, the electronic device under test being removably coupled to the ATE platform, the ATE platform further comprising means for testing the electronic device responsive to the testing program code, the system comprising:

a testing workstation comprising a processor, memory and input/output facilities, the testing workstation being interconnectable to the ATE platform, the input/output facilities of the testing workstation including means for controlling testing of the electronic device on the ATE platform and means for displaying results from the testing of the electronic device;

a library of ATE platform parameters associated with the testing workstation and storing ATE platform parameters for the ATE platform interconnectable to the testing workstation;

means for transforming waveform data into an intermediate representation using the ATE platform parameters in the library, the waveform data comprising events and signals for application during testing to the electronic device under test; and means for completing a template with the intermediate representation, the completed template forming the testing program code specific to the ATE platform interconnectable to the testing workstation;

wherein the library of ATE platform parameters further comprises:

a set of characterization information storing characteristics specific to each of the plurality of ATE platforms; and a set of templates storing electronic device-independent program modules, the means for generating the testing program code further comprising means for forming the testing program code using the program modules for at least one such template with characteristics for the characterization information corresponding to the ATE platform interconnectable to the testing workstation.

2. A system for generating testing program code for testing an electronic device on an automatic test equipment (ATE) platform, the electronic device under test being removably coupled to the ATE platform, the ATE platform further comprising means for testing the electronic device responsive to the testing program code, the system comprising:

a testing workstation comprising a processor, memory and input/output facilities, the testing workstation being interconnectable to the ATE platform, the input/output facilities of the testing workstation including means for controlling testing of the electronic device on the ATE platform and means for displaying results from the testing of the electronic device;

a library of ATE platform parameters associated with the testing workstation and storing ATE platform parameters for the ATE platform interconnectable to the testing workstation;

means for transforming waveform data into an intermediate representation using the ATE platform parameters in the library, the waveform data comprising events and signals for application during testing to the electronic device under test; and means for completing a template with the intermediate representation, the completed template forming the testing program code specific to the ATE platform interconnectable to the testing workstation;

wherein the library further stores ATE platform parameters for a plurality of ATE platforms.

3. A system for generating testing program code for testing an electronic device on an automatic test equipment (ATE) platform, the electronic device under test being removably coupled to the ATE platform, the ATE platform further comprising means for testing the electronic device responsive to the testing program code, the system comprising:

a testing workstation comprising a processor, memory and input/output facilities, the testing workstation being interconnectable to the ATE platform, the input/output facilities of the testing workstation including means for controlling testing of the electronic device on the ATE platform and means for displaying results from the testing of the electronic device;

a library of ATE platform parameters associated with the testing workstation and storing ATE platform parameters for the ATE platform interconnectable to the testing workstation;

means for transforming waveform data into an intermediate representation using the ATE platform parameters in the library, the waveform data comprising events and signals for application during testing to the electronic device under test;

means for completing a template with the intermediate representation, the completed template forming the testing program code specific to the ATE platform interconnectable to the testing workstation; and means for cyclizing simulation results from the testing workstation into the waveform data.

4. A system for generating testing program code for testing an electronic device on an automatic test equipment (ATE) platform, the electronic device under test being removably coupled to the ATE platform, the ATE platform further comprising means for testing the electronic device responsive to the testing program code, the system comprising:

a testing workstation comprising a processor, memory and input/output facilities, the testing workstation being interconnectable to the ATE platform, the input/output facilities of the testing workstation including means for controlling testing of the electronic device on the ATE platform and means for displaying results from the testing of the electronic device;

a library of ATE platform parameters associated with the testing workstation and storing ATE platform parameters for the ATE platform interconnectable to the testing workstation;

means for transforming waveform data into an intermediate representation using the ATE platform parameters in the library, the waveform data comprising events and signals for application during testing to the electronic device under test; and means for completing a template with the intermediate representation, the completed template forming the testing program code specific to the ATE platform interconnectable to the testing workstation;

wherein the intermediate representation comprises a unified data description including pin information, pattern information and format and timing information.

5. A system for generating testing program code for testing an electronic device on an automatic test equipment (ATE) platform, the electronic device under test being removably coupled to the ATE platform, the ATE platform further comprising means for testing the electronic device responsive to the testing program code, the system comprising:

a testing workstation comprising a processor, memory and input/output facilities, the testing workstation being interconnectable to the ATE platform, the input/output facilities of the testing workstation including means for controlling testing of the electronic device on the ATE platform and means for displaying results from the testing of the electronic device;

a library of ATE platform parameters associated with the testing workstation and storing ATE platform parameters for the ATE platform interconnectable to the testing workstation;

means for transforming waveform data into an intermediate representation using the ATE platform parameters in the library, the waveform data comprising events and signals for application during testing to the electronic device under test;

means for completing a template with the intermediate representation, the completed template forming the testing program code specific to the ATE platform interconnectable to the testing workstation; and means for loading the testing program code from the testing workstation into the ATE platform.

6. A method for generating testing program code for testing an electronic device on an automatic test equipment (ATE) platform, the ATE platform being interconnectable to a testing workstation comprising a processor, memory and input/output facilities, the electronic device under test being removably coupled to the ATE platform, comprising the steps of:

maintaining a library of ATE platform parameters associated with the testing workstation and storing the ATE platform parameters for a plurality of ATE platforms in the library;

transforming waveform data into an intermediate representation using the ATE platform parameters in the library, the waveform data comprising events and signals for application during testing to the electronic device under test;

completing a template with the intermediate representation, the completed template forming the testing program code specific to the ATE platform interconnectable to the testing workstation;

controlling testing of the electronic device on the ATE platform; and displaying results from the testing of the electronic device using the input/output facilities of the testing workstation.

7. A method for generating testing program code for testing an electronic device on an automatic test equipment (ATE) platform, the ATE platform being interconnectable to a testing workstation comprising a processor, memory and input/output facilities, the electronic device under test being removably coupled to the ATE platform, comprising the steps of:

maintaining a library of ATE platform parameters associated with the testing workstation and storing the ATE platform parameters for a plurality of ATE platforms in the library;

transforming waveform data into an intermediate representation using the ATE platform parameters in the library, the waveform data comprising events and signals for application during testing to the electronic device under test;

completing a template with the intermediate representation, the completed template forming the testing program code specific to the ATE platform interconnectable to the testing workstation;

loading the testing program code into the ATE platform from the testing workstation; and testing the electronic device responsive to the loaded testing program code on the ATE platform.

8. A method for generating testing program code for testing an electronic device on an automatic test equipment (ATE) platform, the ATE platform being interconnectable to a testing workstation comprising a processor, memory and input/output facilities, the electronic device under test being removably coupled to the ATE platform, comprising the steps of:

maintaining a library of ATE platform parameters associated with the testing workstation and storing the ATE platform parameters for a plurality of ATE platforms in the library;

transforming waveform data into an intermediate representation using the ATE platform parameters in the library, the waveform data comprising events and signals for application during testing to the electronic device under test; and completing a template with the intermediate representation, the completed template forming the testing program code specific to the ATE platform interconnectable to the testing workstation;

wherein the step of maintaining a library further comprises the steps of:

storing characteristics specific to each of the plurality of ATE platforms into a set of characterization information in the library; and storing electronic device-independent program modules into a set of templates in the library, the step of generating the testing program code further comprising forming the testing program code using the program modules for at least one such template with characteristics for the characterization information corresponding to the ATE platform interconnectable to the testing workstation.

9. A method for generating testing program code for testing an electronic device on an automatic test equipment (ATE) platform, the ATE platform being interconnectable to a testing workstation comprising a processor, memory and input/output facilities, the electronic device under test being removably coupled to the ATE platform, comprising the steps of:

maintaining a library of ATE platform parameters associated with the testing workstation and storing the ATE platform parameters for a plurality of ATE platforms in the library;

transforming waveform data into an intermediate representation using the ATE platform parameters in the library, the waveform data comprising events and signals for application during testing to the electronic device under test;

completing a template with the intermediate representation, the completed template forming the testing program code specific to the ATE platform interconnectable to the testing workstation;

transforming waveform data into an intermediate representation, the waveform data comprising events and signals for application during testing to the electronic device under test; and completing a template with the intermediate representation, the completed template forming the testing program code.

10. A method for generating testing program code for testing an electronic device on an automatic test equipment (ATE) platform, the ATE platform being interconnectable to a testing workstation comprising a processor, memory and input/output facilities, the electronic device under test being removably coupled to the ATE platform, comprising the steps of:

maintaining a library of ATE platform parameters associated with the testing workstation and storing the ATE platform parameters for a plurality of ATE platforms in the library;

transforming waveform data into an intermediate representation using the ATE platform parameters in the library, the waveform data comprising events and signals for application during testing to the electronic device under test:

completing a template with the intermediate representation, the completed template forming the testing program code specific to the ATE platform interconnectable to the testing workstation; and cyclizing simulation results from the testing workstation into the waveform data.

11. A method for generating testing program code for testing an electronic device on an automatic test equipment (ATE) platform, the ATE platform being interconnectable to a testing workstation comprising a processor, memory and input/output facilities, the electronic device under test being removably coupled to the ATE platform, comprising the steps of:

maintaining a library of ATE platform parameters associated with the testing workstation and storing the ATE platform parameters for a plurality of ATE platforms in the library;

transforming waveform data into an intermediate representation using the ATE platform parameters in the library, the waveform data comprising events and signals for application during testing to the electronic device under test; and completing a template with the intermediate representation, the completed template forming the testing program code specific to the ATE platform interconnectable to the testing workstation; and cyclizing simulation results received from a further testing workstation interconnectable to the testing workstation into a cyclized waveform description.

12. A method for efficiently generating testing program code for use in automatic test equipment, the testing program code specifying testing for a device under test connected to the automatic test equipment, comprising the steps of:

forming a unified data description using a waveform analyzer module responsive to a waveform description which stores processed simulation results for the device under test; and combining the unified data description with a template using a template completion module to form the testing program code for use in the automatic test equipment, wherein the waveform description is a cyclized waveform description, the method further comprising the step of processing simulation results using a cyclization process module to form the cyclized waveform description;

the step of forming a unified data description further comprising the step of transforming the cyclization waveform description into the unified data description.

13. A method according to claim 12, wherein the step of transforming the cyclization waveform description further comprises the steps of:

transforming pin data information stored in the cyclization waveform description;

transforming pattern data information stored in the cyclization waveform description; and transforming timing and format information stored in the cyclization waveform description.

14. A method according to claim 13, wherein the step of transforming the transforming timing and format information further comprises the step of examining the signals associated with the cyclization waveform description into the format and timing information for testing the device under test.

15. A method according to claim 14, wherein the step of examining the signals further comprises the steps of:

selecting formats, timing and pattern controls for pairs of the signals; and building groups of the signals with common formats, timing and pattern controls.

16. A method according to claim 15, further comprising the step of assigning a timing generator to the signal groups if the automatic test equipment so requires.

17. A method for efficiently generating testing program code for use in automatic test equipment, the testing program code specifying testing for a device under test connected to the automatic test equipment, comprising the steps of:

forming a unified data description using a waveform analyzer module responsive to a waveform description which stores processed simulation results for the device under test;

combining the unified data description with a template using a template completion module to form the testing program code for use in the automatic test equipment; and maintaining a set of characterization information for use in the step of forming a unified data description.

18. A method for efficiently generating testing program code for use in automatic test equipment, the testing program code specifying testing for a device under test connected to the automatic test equipment, comprising the steps of:

forming a unified data description using a waveform analyzer module responsive to a waveform description which stores processed simulation results for the device under test;

combining the unified data description with a template using a template completion module to form the testing program code for use in the automatic test equipment; and maintaining a set of templates for use in the step of combining the unified data description.

19. A method for efficiently generating testing program code for use in automatic test equipment, the testing program code specifying testing for a device under test connected to the automatic test equipment, comprising the steps of:

forming a unified data description using a waveform analyzer module responsive to a waveform description which stores processed simulation results for the device under test; and combining the unified data description with a template using a template completion module to form the testing program code for use in the automatic test equipment;

wherein the waveform description includes a complex shape representing a data pattern associated with a waveform template defined for a number of signals, the step of forming a unified data description further comprising the step of translating the complex shape of the waveform description into the waveform description.

20. A method for efficiently generating testing program code for use in automatic test equipment, the testing program code specifying testing for a device under test connected to the automatic test equipment, comprising the steps of:

forming a unified data description using a waveform analyzer module responsive to a waveform description which stores processed simulation results for the device under test; and combining the unified data description with a template using a template completion module to form the testing program code for use in the automatic test equipment;

wherein the waveform description further comprises a high level description of the complex shape of the waveform description including an indicia of direct waveform characteristics, the step of forming a unified data description further comprising the step of interpreting the high level description of the complex shape into the waveform description.

21. A method for efficiently generating testing program code for use in automatic test equipment, the testing program code specifying testing for a device under test connected to the automatic test equipment, comprising the steps of:

forming a unified data description using a waveform analyzer module responsive to a waveform description which stores processed simulation results for the device under test;

combining the unified data description with a template using a template completion module to form the testing program code for use in the automatic test equipment;

maintaining a library of data for a plurality of the automatic test equipment data;

the step of forming a unified data description further comprising the step of accessing the data library for characteristics for one such automatic test equipment; and the step of combining the unified data description further comprising accessing the data library for a template describing a layout of the testing program code.

* * * * *